United States Patent [19]

McNaney

[11] 4,240,715

[45] * Dec. 23, 1980

[54] GRAPHIC SYMBOL LINE POSITION CONTROL MEANS FOR HIGH SPEED PRINTING

[76] Inventor: Joseph T. McNaney, 8548 Boulder Dr., La Mesa, Calif. 92041

[*] Notice: The portion of the term of this patent subsequent to Mar. 13, 1996, has been disclaimed.

[21] Appl. No.: 26,420

[22] Filed: Apr. 2, 1979

[51] Int. Cl.³ .............................................. G02F 1/33
[52] U.S. Cl. ............................................... 350/358
[58] Field of Search ........................................ 350/358

[56] References Cited

U.S. PATENT DOCUMENTS 4,143,948  3/1979  McNaney .............................. 350/358

Primary Examiner—William L. Sikes

[57] ABSTRACT

The invention relates to an improved optical system for selecting and presenting individual graphic symbols from an illuminated array of such symbols and establishing individual line positions thereof in high speed photocomposing machine applications. A laser source of radiant energy is utilized for illuminating symbols of the array and acousto-optic light reflector means in combination with image projection optics are included in the process of exposing a record medium to light images of graphic symbols and controlling the positions thereof in a line across the medium.

3 Claims, 3 Drawing Figures

GRAPHIC SYMBOL LINE POSITION CONTROL MEANS FOR HIGH SPEED PRINTING

BACKGROUND OF THE INVENTION

This invention relates to co-pending application Ser. No. 836,301 filed Sept. 26, 1977 and now U.S. Pat. No. 4,143,948 and co-pending application Ser. No. 13,799 filed Feb. 2, 1979, wherein individual images selected from an array of graphic symbols are established along an optical axis of recording apparatus for a presentation thereof to a record medium under the control of an acousto-optic light reflector means in combination with image projection optics. Improvements herein include additional acoustooptic means for controlling the line positions of graphic symbols to which the record medium is being exposed.

SUMMARY OF THE INVENTION

The graphic symbol line position control means herein includes the use of a font plate containing an array of symbol shaped windows from which top quality printed matter will stem. Radiant energy from a laser source is directed toward the font plate so as to illuminate windows therein whereby images representative of graphic symbols can be viewed from the position of a light responsive record medium of the system. The record medium, such as photographic film, will be exposed to images of the illuminated windows through projection optics and acousto-optic light reflector means which will permit light rays representative of graphic symbols stemming, selectively, from any of a hundred or more different windows of a font plate to be directed toward prearranged message forming positions across the record medium.

An object of the invention is to further simplify the mechanical requirements of the invention set forth in the co-pending applications noted herein by extending the utilization of acousto-optic light reflecting means for the providing of line by line high speed photographic printing of graphic symbols.

The embodiments of the invention illustrated and described herein exemplify means for meeting these objectives and when read in connection with the drawings hereof the description which follows will provide a better understanding of these and still other objectives of the invention.

DESCRIPTION OF THE INVENTION

Figures 1, 2:
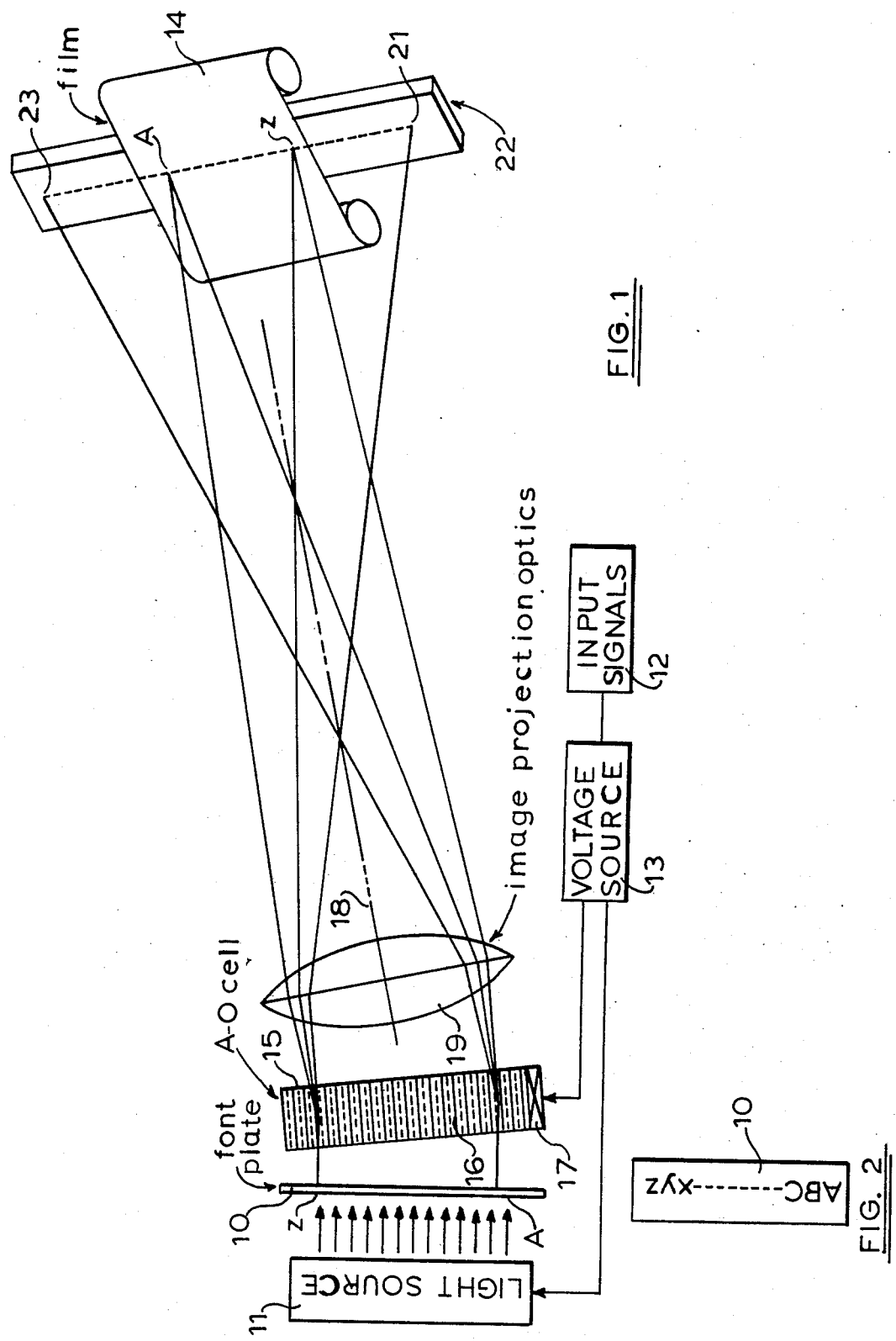
FIG. 1 is a schematic representation of the graphic symbol line position control means of a first embodiment of the invention.
FIG. 2 illustrates the manner in which graphic symbols will appear in the font plate.

Referring now to FIG. 1, the graphic symbol line position control means of the invention includes the use of a font plate 10, from which compositions of printed matter will stem, which is shown in FIG. 2 as containing a single line array of light beam forming windows means ABC - - - xyz. The font plate can be understood as containing at least a hundred such window means representative of letters, numerals, etc.

Radiant energy from a laser source, represented in the drawing by a block diagram light source 11, will be utilized to illuminate window means in the font plate, selectively, whereby any one of a plurality of symbol shaped sources of light can be established at any given time. One example for meeting these particular requirements of the present invention is set forth in applicant's U.S. Pat. No. 4,000,939. However, the operation of the light source will be under the control of input signals 12 and a voltage source 13.

The font plate 10 and a light responsive record medium 14, or a photographic film, can be understood as being positioned at first and second ends of graphic symbol shaped light optical paths of the line position control means of the invention. Intermediate the font plate 10 and the film 14, and closely adjacent to the font plate, there is an acousto-optic light reflector means identified as A-O cell 15, including an interaction medium 16 and acoustic wave generator means 17, and located close to the medium 16 along a common optical axis 18 of the invention optical system means identified as image projection optics 19 are utilized in the establishing of graphic symbols in a line across the film 14.

The voltage source 13 can be understood as a provider of ultrasonic frequency voltages extending over a range of frequencies from 150 MHz to 300 MHz under control of input signals 12. In responding to such voltages the interaction medium 16 is traversed by compression waves effecting periodic stratification of the medium, the density thereof proportional to the applied acoustic power. The distance between two successive planes of maximum density is equal to the wavelength of a given voltage and these strata behave like mirrors, or light refracting prisms, each contributing to a bending of a light path and the degree of which is related to the frequency of the voltage. Light refractions of optimum intensity is obtained when the A-O cell has been positioned along an optical axis of the system so that the orientation of these strata will have been established at the Bragg angle relative to a O-order light path.

Operation of the FIG. 1 embodiment of the invention can be explained by first assuming that the complete series of windows in the font plate, from A to z therein, have been illuminated one after another, and in the absence of any signal to the A-O cell 15 images of these windows could be viewed from the direction of the film, but off to the right of the recording surface. Upon applying the center frequency of 225 MHz to the A-O cell the resulting stratification of the medium 16 will allow the film 14 to be exposed to images of the series of windows along a line noted thereon extending from the letter A to the letter z.

In response to a 150 MHz signal voltage to the A-O cell the series of images will be viewed just to the right of the optical axis 18, whereby the letter A coincides with the initial letter z position on the film and the letter z now occupies the position 21 at the surface of a film support member 22. In response to a 300 MHz signal voltage to the A-O cell the series of images will be viewed just to the left of the optical axis 18, whereby the letter z coincides with the initial letter A position on the film and the letter A now occupies the position 23 at the surface of the film support member 22. A program of input signals calling for the illumination of a predetermined one of the symbols at the font plate and thereupon calling for the exposure of a predetermined one of, say, one hundred possible line positions at the film would require a voltage of but a single frequency. The particular frequency, however, will depend, first, on where in the font plate the symbol is located and then on which one of the line positions the symbol is to be directed toward. And although in each the ultrasonic frequency related strata extends across the total aperture of the A-O cell, the illuminated window will be viewed from a predetermined line position at the film along an optical path established by only that section of the total strata capable of effecting an optical relationship between the window and the predetermined line position.

Figure 3:
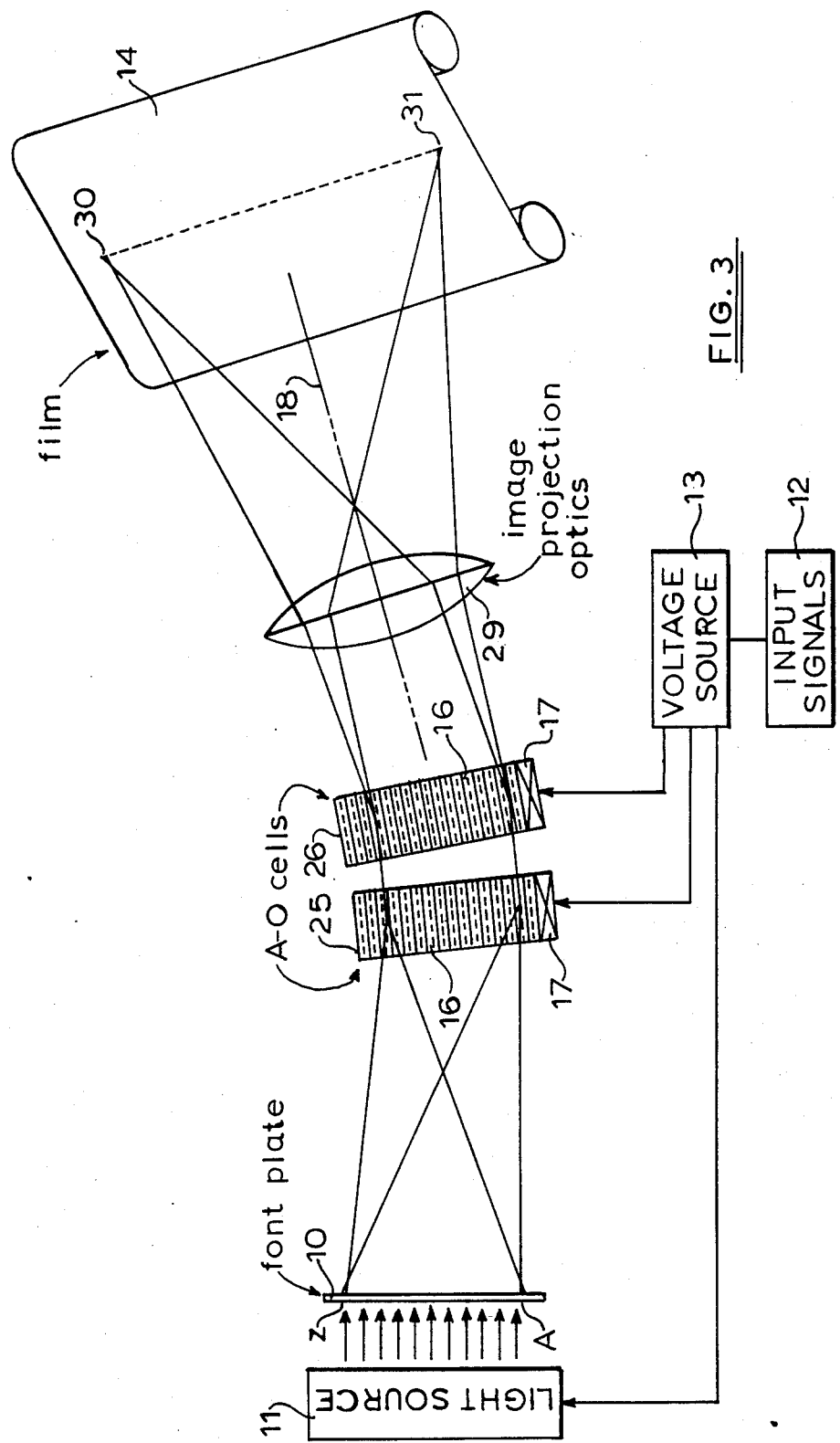
FIG. 3 is a schematic representation of the graphic symbol line position control means of a second embodiment of the invention.

Referring now to FIG. 3, this second embodiment of the invention differs from the first embodiment only in the manner in which acousto-optic means are utilized in the selecting of illuminated symbol shaped windows in the font plate and in the controlling of their respective positions in a line across the record medium. A dual system of A-O cells is included, one being the image selector 25 and the other being the image director 26. The image selector 25 will be operated so as to provide cylindrical lensing effects in the process of viewing individual windows in the font plate 10. In doing so a range of ultrasonic frequency voltages from the source 13 is connected to the transducer 17 of cell 25, presenting a corresponding range of compression waves across the width of the medium 16. A view of the letter A shaped window, for example, having a width dimension of 0.005" could be expanded by means of the light refracting strata of the medium 16 to a width of 0.5" when viewed through this medium from the direction of the film 10. Each of the windows of the font plate will be viewed in a similar manner when illuminated and under the control of voltages being connected to the transducer of the cell 25.

The image director 26 in combination with the image projection optics 29, and under the control of ultrasonic frequency voltages connected to the transducer 17 of cell 26, will allow images of individual ones of the illuminated windows at the font plate to be established at, for example, any of a hundred or more different line positions across the film relative to a reference position 30 and extending to an end of line position 31. The light refracting strata of the medium 16 of cell 26 controls the direction from which rays of light stemming from a window will be viewed while the focussing of a given symbol shaped window at the film 10 is being ntrolled by the image projection optics 29.

The important similarities existing in the embodiments of FIG. 1 and FIG. 3 will be found in the fact that the acoustic wave light reflecting conditions established within the interaction medium of the acousto-optic light reflection control means of these embodiments include graphic symbol line position control means essential to the providing of line by line printing on a record media independent of the use of such mechanical reflector means as disclosed in applicant's aforementioned copending application Ser. No. 836,301 and application Ser. No. 13,799.

It should be understood by those skilled in the arts pertaining to the construction and application possibilities of the invention that the embodiments included herein illustrate in a very limited sense the usefulness of the invention. Although not shown in the FIG. 3 embodiment, additional optical elements can be included intermediate the font plate 10 and the A-O cell 25 to co-operate with the latter in the process of selecting the symbols of the font plate and presenting images thereof at the reflection plane of the A-O cell 26. And also, the light responsive record medium is not to be limited to the use of film media as illustrated, which can take the form of a wide variety of still other such media. Therefore, the invention includes other modifications and equivalents as they may be seen by those skilled in the arts, but still being within the scope and intent of the appended claims.

I claim:

1. In a graphic symbol line position control means, a laser source of light;

font plate means for providing an array of graphic symbols and means for exposing symbols of said array, selectively, to light from said laser source for providing any one of a plurality of individual graphic symbol shaped sources of light;

a light responsive record medium;

said array of graphic symbols and said record medium positioned, respectively, at first and second ends of graphic symbol shaped light beam optical paths of said line position control means;

optical means positioned along an optical axis of said line position control means intermediate said array of graphic symbols and said record medium for projecting an image of a graphic symbol selectively exposed to light from said laser source toward said record medium;

acousto-optic light reflector means, including acoustic wave generator means and an interaction medium, positioned intermediate said array of graphic symbols and said optical means positioned along said optical axis;

a source of ultrasonic frequency voltages and means for connecting voltages from said source to said light reflector means for an establishing of any of a number of different acoustic wave light reflecting conditions within said light reflector means;

wherein the improvement comprises:

(a) means for exposing a predetermined one of said graphic symbols of the array to light from said laser source and establishing, simultaneously, a predetermined one of said light reflecting conditions within said light reflector means, said established light reflecting condition controlling a directing of light from said predetermined one of said symbols to said record medium and an exposing of said medium to a light image of said symbol so as to effect a coinciding of said image with a point of reference display position at said record medium;

(b) means for exposing another predetermined one of said graphic symbols of the array to light from said laser source and establishing, simultaneously, another predetermined one of said light reflecting conditions within said light reflector means, said other established light reflecting condition controlling a directing of light from said other predetermined one of said symbols to said record medium and an exposing of said medium to a light image of said other symbol so as to effect a coinciding of said image with any one of a plurality of secondary display positions in relation to said point of reference display position at said record medium.

2. The invention as set forth in claim 1, wherein said acousto-optic light reflector means includes first and second light reflectors, each having acoustic wave generator means and an interaction medium, and means for extending, respectively, a combination of first and second ultrasonic frequency voltages thereto for establishing correspondingly first and second light reflecting conditions therein for said controlling of a directing of light from said symbols to said record medium.

3. In an image projection control system including a source of light representative of an array of graphical information, optical means positioned along an optical axis of said system, and means for selecting predetermined portions of said array of information for an allowing of optical images of said selected portions to be viewed through said optical means from along said optical axis, wherein the improvement comprises:

(a) said means for selecting said predetermined portions of the information including acousto-optic light reflector means, said reflector means having acoustic wave generator means and an interaction medium positioned intermediate said array of graphical information and said optical means along said optical axis;

(b) a source of ultrasonic frequency voltages and means for connecting voltages from said source to said wave generator means for an establishing of any of a number of different acoustic wave light reflecting conditions within said interaction medium;

(c) means for establishing a predetermined one of said light reflecting conditions within said interaction medium, said established light reflecting condition controlling a viewing of light from a predetermined one of said portions of the information from along said optical axis and a viewing of an optical image of said one portion through optical means from along said optical axis;

(d) means for establishing another predetermined one of said light reflecting conditions within said interaction medium, said other established light reflecting condition controlling a viewing of light from another predetermined one of said portions of the information from along said optical axis and a viewing of an optical image of said other portion through said optical means from along said optical axis.

* * * * *